(12) United States Patent
Yates et al.

(10) Patent No.: US 7,101,209 B2
(45) Date of Patent: Sep. 5, 2006

(54) TEST SOCKET

(75) Inventors: Alan G. Yates, San Jose, CA (US);
Olga M. Stanescu, Cupertino, CA (US); Sean K. Galligan, San Jose, CA (US)

(73) Assignee: Gold Technologies, Inc., San Jose, CA (US)

( * ) Notice: Subject to any disclaimer, the term of this patent is extended or adjusted under 35 U.S.C. 154(b) by 0 days.

(21) Appl. No.: 10/764,808

(22) Filed: Jan. 26, 2004

(65) Prior Publication Data

US 2005/0164530 A1    Jul. 28, 2005

(51) Int. Cl.
*H01R 13/62* (2006.01)

(52) U.S. Cl. .................................... 439/331; 324/754

(58) Field of Classification Search .................. 439/73, 439/261, 266, 296, 331 I, 342; 324/754, 324/755
See application file for complete search history.

(56) References Cited

U.S. PATENT DOCUMENTS

| | | | | |
|---|---|---|---|---|
| 3,849,834 A | * | 11/1974 | Mayer | 16/332 |
| 4,341,100 A | * | 7/1982 | Kohlhage | 70/63 |
| 4,456,318 A | * | 6/1984 | Shibata et al. | 439/68 |
| 4,717,346 A | * | 1/1988 | Yoshizaki | 439/71 |
| 4,950,980 A | | 8/1990 | Pfaff | 439/296 |
| 5,057,031 A | | 10/1991 | Sinclair | 439/261 |
| 5,147,213 A | | 9/1992 | Funk et al. | 439/266 |
| 5,444,877 A | * | 8/1995 | Kumarasurier | 4/246.1 |
| 5,482,471 A | * | 1/1996 | Mori et al. | 439/263 |
| 5,545,050 A | | 8/1996 | Sato et al. | 439/331 |
| 5,646,447 A | | 7/1997 | Ramsey et al. | 257/727 |
| 5,647,756 A | * | 7/1997 | Twigg et al. | 439/331 |
| 5,831,160 A | * | 11/1998 | Steketee | 73/431 |
| 6,086,387 A | * | 7/2000 | Gallagher et al. | 439/71 |
| 6,146,178 A | | 11/2000 | Walkup et al. | 439/342 |
| 6,353,329 B1 | | 3/2002 | Kiffe | 324/760 |

* cited by examiner

*Primary Examiner*—Thanh-Tam Le
(74) *Attorney, Agent, or Firm*—Schneck & Schneck; Thomas Schneck; David M. Schneck

(57) ABSTRACT

A test device for testing integrated circuits includes a lid and a base joined at a hinge and secured together with a latch. Within the base is some form of socket body that electrically connects the integrated circuit under test to the item the socket is mounted to (i.e. load board). Attached to the lid are cam ratcheting levers. A pressure plate is attached to cam ratcheting levers. The cam ratcheting levers provide a rotating means for lowering a pressure plate by the use of the cam groove within the cam ratcheting levers. The means for lowering a pressure plate may allow incremental lowering of a pressure plate through the ratcheting action of the cam ratcheting levers. The base may include a sight groove for examination of the integrated circuit and internal socket parts.

10 Claims, 3 Drawing Sheets

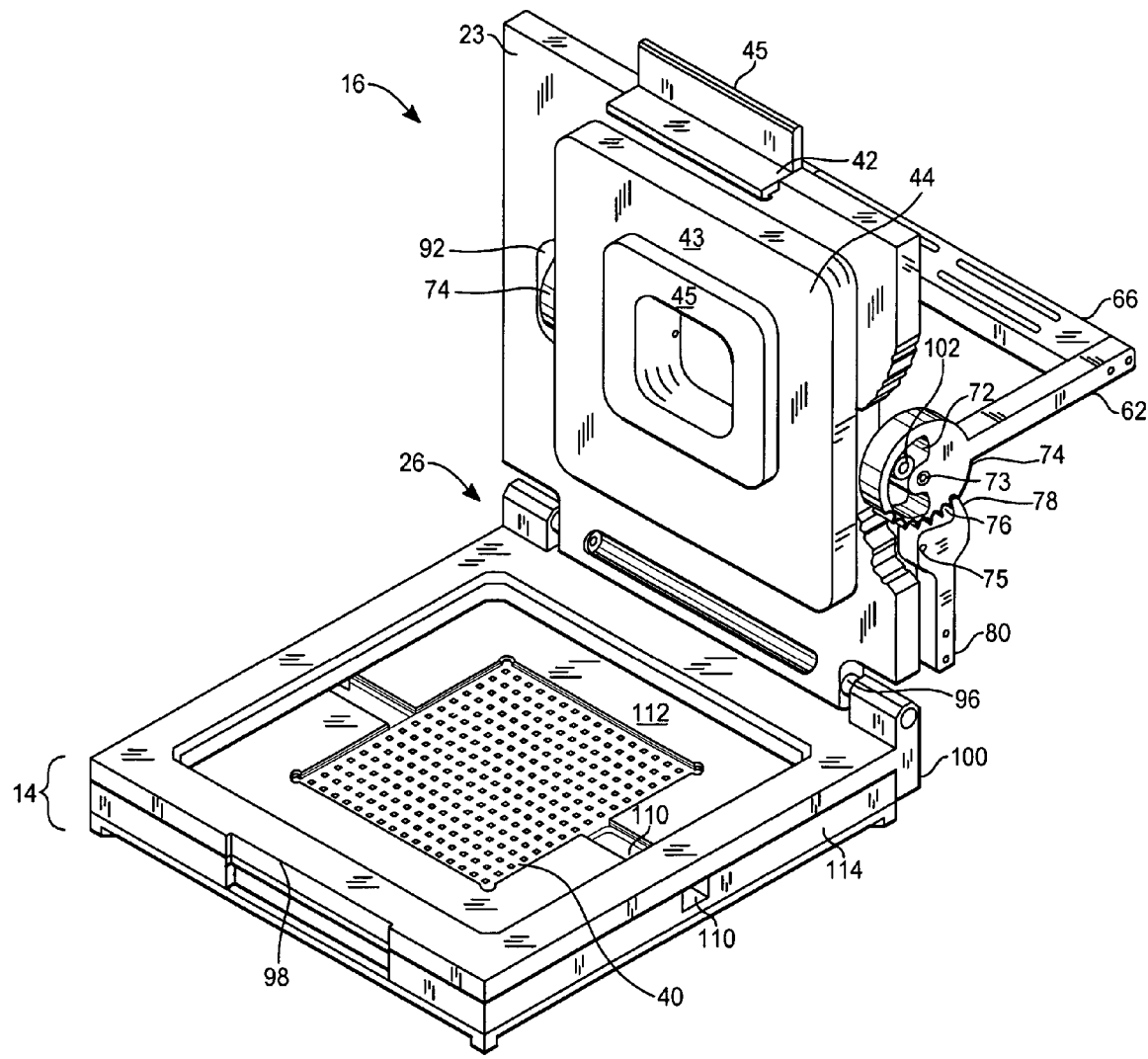
Fig._3

TEST SOCKET

TECHNICAL FIELD

The present invention relates to devices for testing integrated circuits.

BACKGROUND OF THE INVENTION

Integrated circuits are commonly tested before installation. Test sockets are primarily used to determine whether the integrated circuit can make the required electrical connections to pads or leads on the integrated circuit package. This requires an integrated circuit to be placed in the test device under test conditions to allow for both thermal testing of the package and checking terminal connections. Given the high volume of integrated circuits to be tested, it is preferable if the device is adaptable to automation.

U.S. Pat. No. 6,353,329 "Integrated Circuit Test Socket Lid Assembly" to Kiffe discloses a test socket for integrated circuits (ICs). The test socket includes a socket body, allowing electrical connections to be made between the terminals of an integrated circuit and a test board. The socket is mounted in a base that is attached to a lid by a removable hinge. The removable hinge is noted within this reference as the means allowing this device to be adapted to automation. A pressure plate and an actuator for the pressure plate are retained within a frame of the lid by a cover plate. A latch secures the lid to the base. Activation of the actuator exerts force on the pressure plate. An integrated circuit held within the test device is moved to the socket by the pressure plate. The bottom surface of the pressure plate includes a plurality of channels extending from an open central area of the pressure plate to the peripheral edges of the pressure plate. This provides some ability to allow air to circulate, although no flow through circulation is possible.

U.S. Pat. No. 5,646,447 "Top Loading Cam Activated Test Socket for Ball Grid Arrays" to Ramsey et al. discloses a socket where an IC package may be inserted and removed. An IC is placed into a hinged lever arm forming a frame around a socket. The base of the socket has a slidable plate having holes with elongated contacts extending into each hole. The socket also has a cam axle and cam handle located opposite the hinged lever arm. When the frame is pressed down, the frame contacts the cam handle, which causes the slidable plate to move, driving the IC contacts into contact with the socket contacts.

U.S. Pat. No. 5,545,050 "IC Socket" to Sato et al. discloses an electrical IC socket which has Y-shaped contact pieces which are more flexible in accommodating a lead from an IC chip, thereby ensuring good contact. The socket has a lid which is spring-biased and, when lowered, pushes the leads against the heads of the contact pieces. The above references are incorporated by reference as if set forth in their entirety herein.

It is an object of the invention to provide a test device for integrated circuits. Ideally, such a test device is adaptable to automation and allows for the thermal testing of integrated circuits. This test device preferably would allow integrated circuit packages of varying height into the test device, allow viewing of the integrated circuit during the test process, provide a means to align the terminals of the integrated circuit, and provide a means to hold the integrated circuit during the test process.

SUMMARY OF THE INVENTION

The above objects have been achieved with a device for testing integrated circuits. The device includes a base for holding the socket body. The test socket has a means for receiving the terminals (e.g. pad, pins, or other terminals) of an integrated circuit. The lid is joined to the base by a hinge. The lid may be secured by a locking mechanism that securely holds the lid and base together. A test device, such as an integrated circuit, is held between the lid and base. A pressure plate is retained within the lid and guided by the opening of the lid. A cam lever for lowering the pressure plate in the lid is used to bring the pressure plate into contact with the integrated circuit. Pressure exerted by the pressure plate brings the terminals of the integrated circuit into contact with the socket body.

The cam lever is a device joined to the pressure plate and mechanically linked to the lid to provide an even pressure on the pressure plate to lower the pressure plate towards the socket, bringing the test device into contact with the socket body. The cam lever may be a cam ratcheting lever which allows the pressure plate to be incrementally lowered until the test device is in position. A lock may be used with the ratcheting device to provide a secure means for arresting the position of the ratcheting means. The lock may be spring biased, to allow for simplified release of the ratcheting means.

The device may also include a channel on the pressure plate and/or a channel on the base to view the test device and internal socket parts.

BRIEF DESCRIPTION OF THE DRAWINGS

FIG. 3 is a perspective view of the device of FIG. 1 with the lid open and a cutaway exposing the cam, ratchet, and bearing mechanism.

DETAILED DESCRIPTION OF THE INVENTION

The test device of the present invention allows for the testing of integrated circuits. The integrated circuits illustrated in the embodiments have an array of pins (leads) extending from the bottom of the integrated circuit. However the present test device may accommodate pins, pads or any other terminals on an integrated circuit. If pins are part of the test device (i.e. the device having terminals, the integrated circuit), the socket into which the terminals of the integrated circuit are received may or may not have an array of openings to accommodate the terminals of the integrated circuit device. The socket has some form of conductors that contact the terminals of the integrated circuit. For example the socket body could be pogo pins. It is also possible to employ spring contacts, conductive elastomers, stamped metal contacts, metal foils, or any other type of contactor in the socket to test the integrated circuits.

The test device (integrated circuit) may alternatively include leadless pads. The test socket could use a biased ball array to engage the pads, allowing for the testing of the integrated circuit. The socket would then be designed to accommodate these pads. Either pins, pads, a combination of pins and pads, or any other terminal type could be tested using a designed socket. Both standardized and custom designed sockets for use in the present testers are commercially available from Gold Technologies (San Jose, Calif.) as well as other sources.

Figure 1:
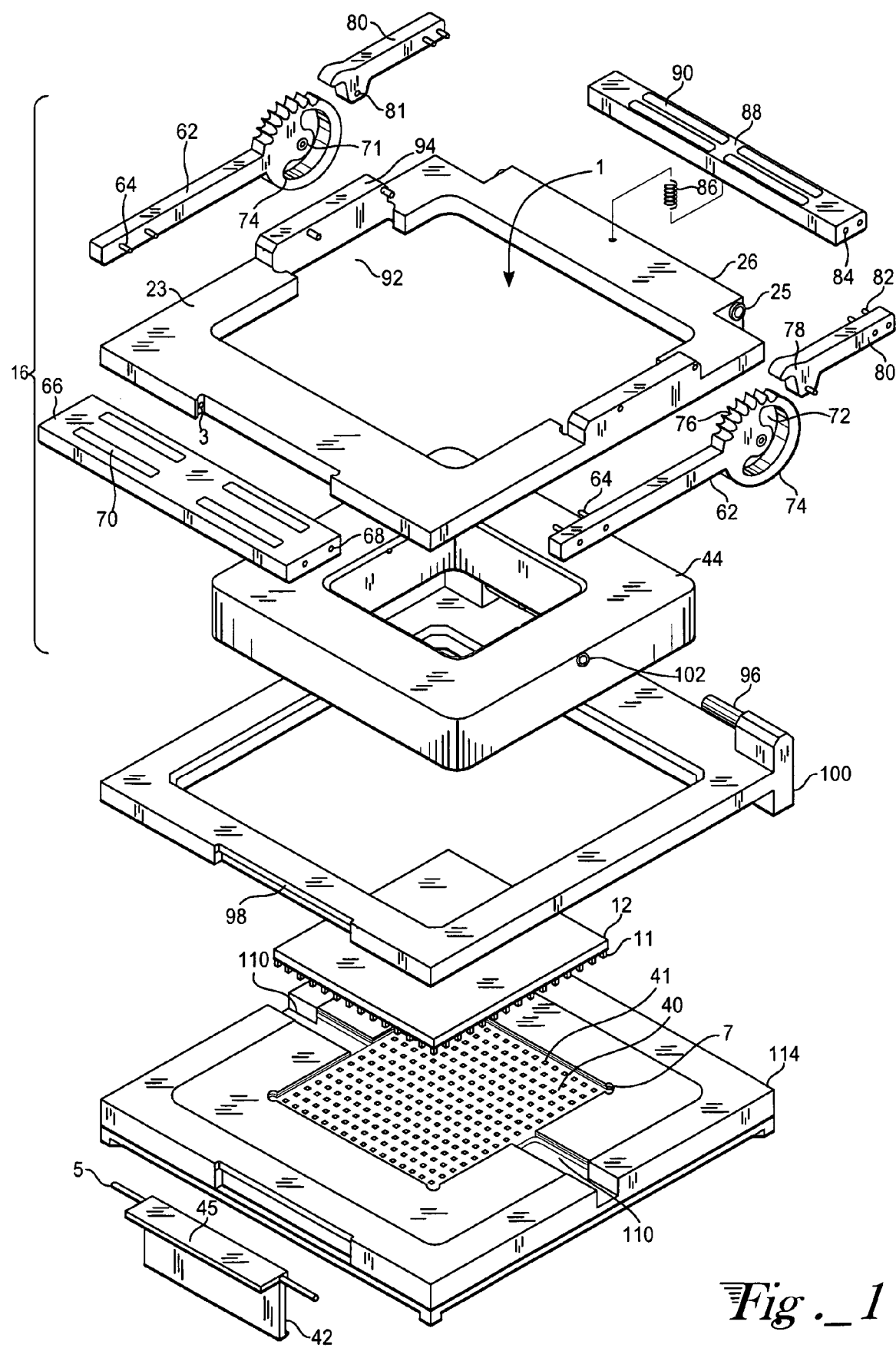
FIG. 1 is an exploded view of an embodiment of the test device having a cam means for lowering the pressure plate.

An embodiment is illustrated in FIGS. 1–3. In FIG. 3, the open device illustrates the component parts. A base, composed of a base bottom 114 and a base top 100 with hinge 26 is joined to a lid assembly 16 by a hinge 26. Alternatively the hinge 26 may be directly secured to the base bottom 114, if the base top 100 is not required. A pin 96 extending from base top 100 extends into a hole on lid assembly 16, joining the lid to the base. When the device is closed, locking mechanism 42 allows lid assembly 16 to be secured onto base 14. An integrated circuit inserted over socket 40 would be retained at the socket location within the test device. A tab 45 on locking mechanism 42 allows manual or mechanical operation of locking mechanism 42. The locking mechanism latches onto lip 98, on base top 100 holding base 14 and lid assembly 16 securely together. Alternatively the locking mechanism 42 may latch on base 114 if the base top 100 is not required.

Base 14 holds a test socket 40. A raised section 112 on base bottom 114 define the edges of the socket well, providing a confined area where the chip is to be inserted. A slight groove 110 extends through base bottom 114 from the socket area to the side of the test device. This groove or channel provides a side access to the chip, and method to view the integrated circuit, and a method to view the internal parts of the socket when the lid is closed. When the lid assembly is raised, a robotic gripper could grip the integrated circuit that was tested by the side, extract this IC, and replace this IC with a new IC to test. Alternatively, this process could be effected manually. In either case, the channel aids in extraction of the integrated circuit. In addition to the channel on the base, channels may also extend into the pressure plate. This allows viewing of the test device.

The lid assembly 16 includes a lid 23 and a pressure plate 44. When the lid assembly 16 is closed onto base 14, surface 43 on pressure plate 44 is positioned over surface 112 on base bottom 114. In addition, surface 43 on pressure plate 44 is positioned over test socket 40. If an integrated circuit is positioned over the test socket 40, surface 43 is positioned to contact the integrated circuit and provide an even pressure to bring the integrated circuit into contact with the socket body in the test socket 40.

On opposing sides of pressure plate 44 a bearing assembly 102 is mounted. Bearing assembly is affixed onto the side of pressure plate 44 such that bearing extends from a fixed location on the sides of the pressure plate. A rotatable element of bearing assembly extending from the side of pressure plate 44 may rotate. The rotating element of bearing assembly 102 extends through cam groove 72 on cam ratchet head 74. A central hub 73 on cam ratchet head 74 allows the cam ratchet device to be affixed and onto lid frame 23 within recess 92. Extending from cam ratchet head 74 is an arm 62. Bar 66 joins the arms of two cam ratchet heads 74. The arms 62 provide a mechanical leverage advantage for lowering the pressure plate. Thus, the arms and cam head form a cam lever for translating the rotation of the cam head into a vertical force to lower the pressure plate. In the preferred embodiment the cam lever includes a ratcheting mechanism on the cam head. Bar 66 allows both arms to be manually or mechanically moved at the same time. This provides an even force on the pressure plate 44. As bar 66, connected to arm 62, is rotated, the pressure plate is lowered. The pressure plate 44 is guided by the opening 1 in the lid 23 to keep the pressure plate 44 from moving from side to side. (See FIG. 1)

The cam ratchet head 74 may be held in position by tooth 78, mounted on arm 80. Tooth 78 acts as a lock for the ratchet device. When tooth 78 is engaged with the teeth 76 on the exterior circumference of ratchet head 74 the ratchet head 74 is locked in place. Arm 80 extends from tooth 78. Pin 75 allows the locking device to be mounted on lid 23.

Figure 2A:
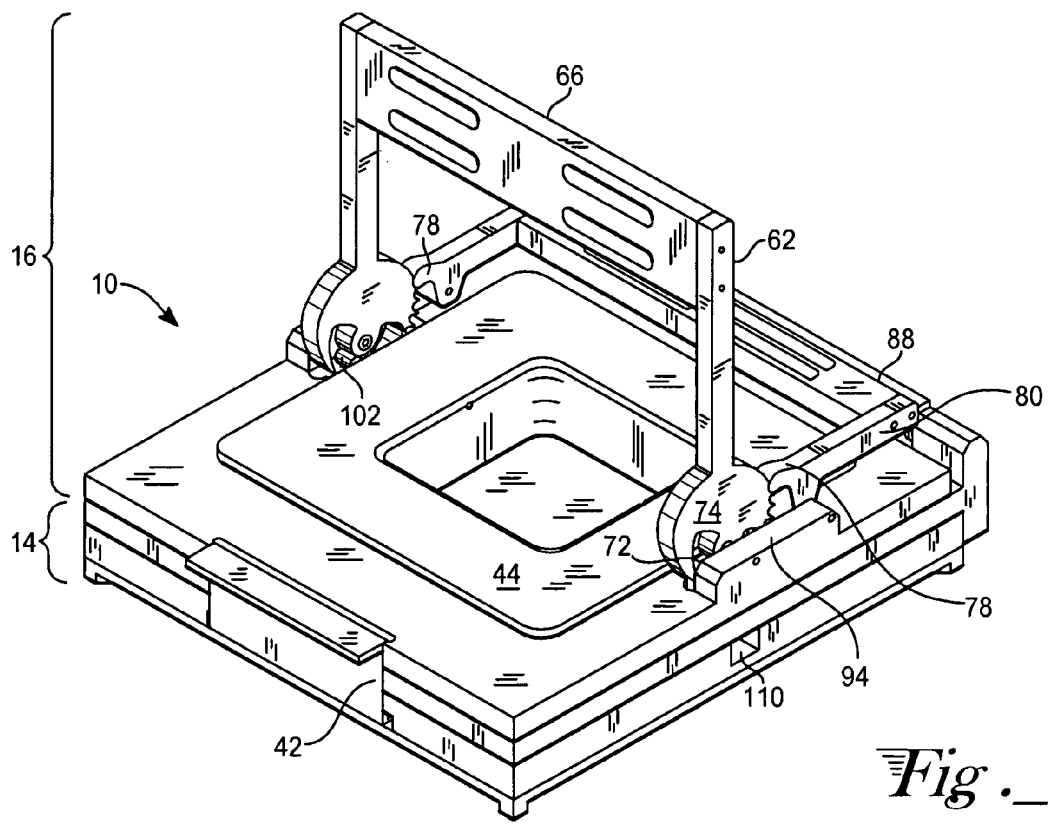
FIG. 2a is a perspective view of the device of FIG. 1 with the pressure plate raised.
Figure 2B:
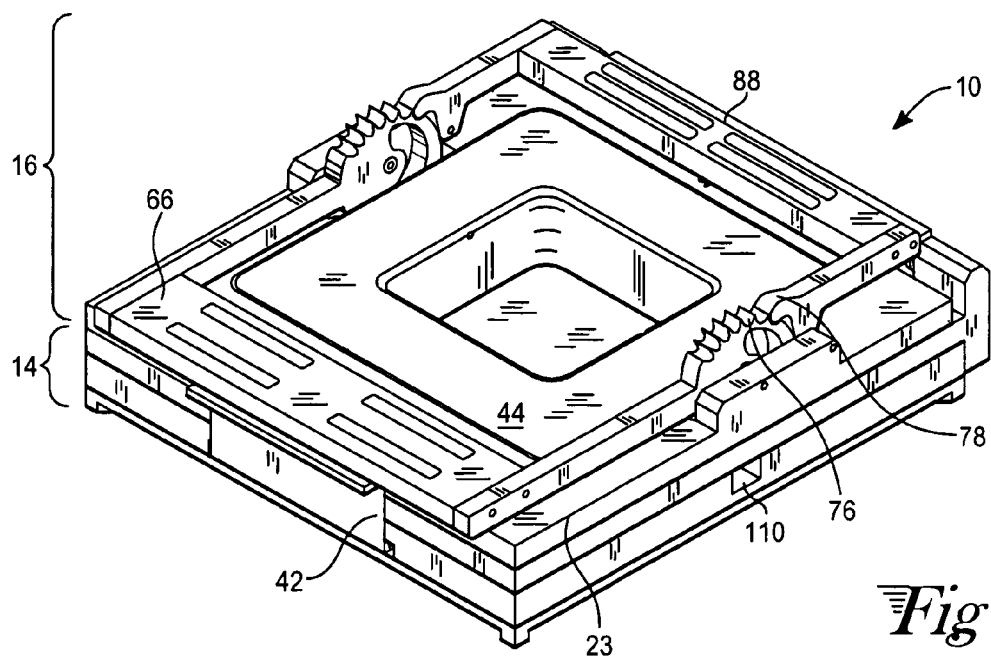
FIG. 2b is a perspective view of the device of FIG. 1 with the pressure plate lowered.

FIGS. 2a, 2b illustrate the movement of the ratcheting and cam mechanism. In these views base 14 is shown secured to lid assembly 16 by latch 42. Channel 110 provides an opening from outside of the test device 10 to the interior area where the integrated circuit is positioned. A central hole in pressure plate 44 also allows for viewing of the integrated circuit from the top during the test process.

In FIG. 2a, the pressure plate is shown in the raised position. In this position, the integrated circuit is not pressed into the socket. Bearing 102 is at a central position in groove 72 on cam ratchet head 74. Cam ratchet heads 74 on opposing sides of the pressure plate 44 each have an arm 62 which extends from the ratchet heads 74. Arms 62 are linked by bar 66. Bar 66 may be manually or robotically moved. As bar 66 is moved to the surface of the lid assembly, the bearing 102 will move along the path defined by cam groove 72 in cam ratchet head 74. Bar 66 allows both of the cam ratchet heads 74 to move synchronously, allowing an even pressure to be exerted on either side of pressure plate 44. As pressure plate 44 is lowered, the integrated circuit's terminals below pressure plate 44 are moved into contact with the socket body in the test sockets base 14.

Teeth 78 on arms 80 lock the cam ratchet head 74 in a fixed rotational position when teeth 78 are engaged on teeth 76 of the cam ratchet head 74. Arms 80 are joined to bar 88. Bar 88 may be pressed, pivoting the locking device on pin 75 and moving teeth 78 out of engagement with teeth 76 on cam ratchet head 74. When this locking mechanism is disengaged, the pressure plate may be moved up or down using the means on cam ratchet head.

In FIG. 2b, the device is shown with the pressure plate 44 fully lowered. Bar 66 is lowered towards the lid 23, rotationally moving cam ratchet heads 74. The bearing assemblies move in the cam groove 72 to one end of cam groove 72. In this position, the IC held within test device 10 is pressed by pressure plate 44 into the proper position in the test socket base.

In FIG. 3, the cam ratchet head 74 is attached by pin 73 to the lid 23 upon which cam head 74 rotates. As the cam ratchet head 74 rotates, cam groove 72 moves the bearing assembly 102 in the vertical plane, thereby allowing the pressure plate 44 to move down towards the socket base 14.

The locking mechanism for the cam ratchet head allows the pressure plate to be held in a fixed position during a test process. The locking mechanism of the teeth within the cam ratchet head allows incremental lowering or raising of the pressure plate (for example in 0.088 inch increments), as the cam ratchet head rotates. The cam groove within the cam ratchet head creates a relationship between the rotational movement of the cam ratchet head and the vertical movement of the pressure plate (for example with every 1 degree of rotational travel of the cam ratchet head the pressure plate moves by 0.0005 inch increments in a vertical direction). In an automated process, bars 66 and 88 may be robotically engaged. For testing of leadless ICs or integrated circuits with varying package thickness, bar 66 may be only partially raised so that the pressure plate is only raised slightly. For testing integrated circuits with pins, bar 66 may be fully raised as shown in FIG. 2a when the integrated circuit 12 is inserted. During testing, bar 66 may be partially or fully lowered.

In the exploded view of FIG. 1, base bottom 114 is shown holding socket 40. Holes 41 in socket 40 receive the pins 11 on an integrated circuit 12. Two features aid in the insertion and extraction of the integrated circuit 12 from the socket. Recessed corners 7 allow for easier insertion of the chip into the socket 40 on the test device. In addition channels 110 in base bottom 114 allow the sides of the integrated circuit to be manually or mechanically gripped. This provides an effective means for insertion of the integrated circuit 12 in the test device.

Base top 100 is shown mounted on base bottom 114. These two elements collectively may make up the base 14 in this embodiment or the base bottom 114 will wholly make up the base. A hinge pin 96 on base top 100 allows base top to be attached to lid assembly 16 by inserting pins 96 into hole 25 on lid top frame 23.

A latch 42 may secure together lid assembly 16 to the base 14. Pins 5 on latch 42 are secured in holes inside groove 3 on lid top frame 23. The protruding tab 45 on latch 42 may be secured onto lip 98 on base top plate 100. Tab 45 may be mechanically or manually engaged to pivot latch 42 out from lip 98, allowing the lid assembly 16 to be raised on the hinge and opened. In the open orientation, integrated circuit 12 may be inserted or removed from the test device. In the closed orientation the integrated circuit 12 is held within the device between the base 14 and the lid assembly 16.

Pressure plate 44 is attached to the lid 23 by bearing 102. Bearing 102 is affixed on two sides of pressure plate 44. Bearing 102 also extends through groove 72 on cam ratchet head 74. Cam ratchet head 74 is held within recess 92.

In this embodiment, a pair of cam ratchets each include cam ratchet heads 74 having internal cam groove 72. In addition, each cam ratchet head 74 has external teeth 76 on a section of the exterior circumference of cam ratchet head 74. Extending from cam ratchet head 74 is arm 62. Pins 64 at the end of arm 62 distal from cam ratchet head 74 are inserted into holes 68 of bar 66. Bar 66 may include slots 70. These slots reduce the weight and material requirements of bar 66. In addition, slots 70 may provide a means for automated use of the test device by providing a location where a robotic gripper could attach to the device.

Tooth 78 on arm 80 allows locking of cam ratchet head 76 in a fixed position, arresting the cam ratchet head movement. Tooth 78 extends from arm 80, which is linked to bar 88. Pins 82 on arm 80 fit into holes 84 on bar 88 to allow attachment of the arms to the bar. Bar 88 is spring biased against lid 23 by spring 86. Bar 88 may be depressed, pivoting tooth 78 out of engagement with tooth 76 on cam ratchet head 74. When bar 88 is released, spring 86 brings tooth 78 back into engagement with the tooth 76 on ratchet head 74.

The teeth on the ratchet head allow arresting of the movement of the pressure plate in discrete intervals using a mechanical means. Advancing in mechanical intervals allows the pressure plate to match the height of the IC under test. A flatter IC could have the pressure plate initially positioned lower to position the IC for optimal contact with the socket body. In addition, such incremental movement helps prevent exerting too much force on an IC during a test and damaging the IC or the tester.

The device may be made of electrical grade thermoplastic or other durable materials. Polyamide-imide plastics provide high durability, have manufacturing advantages, and perform well under a range of conditions.

What is claimed is:

1. A device for testing integrated circuits comprising:
   a base;
   a socket body held in the base for contacting a plurality of terminals from an integrated circuit;
   a lid assembly including a pressure plate having a first and a second bearing assembly on opposing sides of said pressure plate;
   a hinge joining said lid assembly to said base;
   a locking mechanism allowing locking of said lid to said base;
   a first and a second lever;
   a first and second ratchet head each at one end of said first and said second lever respectively;
   a plurality of teeth on an exterior circumference of each of said first and second ratchet head;
   an arc groove on each of said first and said second ratchet head, wherein said first and second bearing assembly are each respectively disposed within said first and said second arc groove such that rotation of said ratchet head causes vertical movement of said pressure plate; and
   a means for engaging said teeth, thereby preventing rotation of said first and said second ratchet head.

2. The device of claim 1, further including a sight groove on the base, said sight groove allowing a user to view the integrated circuit within said test socket.

3. The device of claim 1, wherein said first and second levers are joined by a linking bar.

4. The device of claim 1, wherein said means for engaging said teeth is spring biased.

5. The device of claim 1, wherein said pressure plate may include an open central area through which the integrated circuit may be viewed.

6. The device of claim 1, wherein said socket body includes pogo pins.

7. A device for testing integrated circuits comprising:
a base;
a socket body held in the base for contacting a plurality of terminals from an integrated circuit;
a lid assembly including a pressure plate having a first and a second bearing assembly on opposing sides of said pressure plate;
a hinge joining said lid assembly to said base;
a locking mechanism allowing locking of said lid to said base;
a first and a second levers;
a first and a second ratchet head each at one end of said first and said second lever respectively;
a plurality of teeth on an exterior circumference of each of said first and second ratchet head;
an arc groove on each of said first and said second ratchet head, wherein said first and second bearing assembly are each respectively disposed within said first and said second arc groove such that rotation of said first and second ratchet head causes vertical movement of said pressure plate;
a lock mechanism positioned to engage said teeth, thereby preventing rotation of said first and said second ratchet head; and
a sight groove which extends through said base to allow for visual examination of the integrated circuit during test.

8. The device of claim 7, wherein said lock mechanism positioned to engage said teeth is spring biased.

9. The device of claim 7, wherein said pressure plate includes an open central area through which said integrated circuit may be viewed.

10. The device of claim 7, wherein said socket body includes pogo pins.

* * * * *

UNITED STATES PATENT AND TRADEMARK OFFICE
CERTIFICATE OF CORRECTION

| | |
|---|---|
| PATENT NO. | : 7,101,209 B2 |
| APPLICATION NO. | : 10/764808 |
| DATED | : September 5, 2006 |
| INVENTOR(S) | : Alan G. Yates, Olga M. Stanescu and Sean K. Galligan |

It is certified that error appears in the above-identified patent and that said Letters Patent is hereby corrected as shown below:

Column 7, claim 7, line 3, "a socket body held in the base" should read:

-- a socket body within said base --.

Signed and Sealed this

Third Day of June, 2008

JON W. DUDAS
*Director of the United States Patent and Trademark Office*